United States Patent [19]

Miyamoto et al.

[11] Patent Number: 5,040,992
[45] Date of Patent: Aug. 20, 1991

[54] MOUNTING STRUCTURE FOR ELECTRONIC DEVICE

[75] Inventors: Mitsuo Miyamoto, Hadano; Fumiyuki Kobayashi, Sagamihara; Shizuo Zushi, Hadano; Norio Sengoku, Hadano; Yoshiaki Horita, Hadano, all of Japan

[73] Assignee: Hitachi, Ltd., Tokyo, Japan

[21] Appl. No.: 444,859

[22] Filed: Dec. 4, 1989

[30] Foreign Application Priority Data

Dec. 6, 1988 [JP] Japan .................. 63-307030

[51] Int. Cl.⁵ .................................. H05K 7/00
[52] U.S. Cl. .......................... 439/61; 361/415; 439/928
[58] Field of Search ............ 439/61, 77, 55, 928; 361/412, 413, 415; 379/326, 327, 328

[56] References Cited

U.S. PATENT DOCUMENTS 4,321,654  3/1982  Nakajo et al. ............... 361/415
4,682,268  7/1987  Okano et al. ................. 361/413

FOREIGN PATENT DOCUMENTS 52-22425  2/1977  Japan ........................... 439/77

OTHER PUBLICATIONS

IBM Bulletin, Carter, vol. 21, No. 3, p. 1137, 8-1978.

Primary Examiner—Neil Abrams
Attorney, Agent, or Firm—Fay, Sharpe, Beall, Fagan, Minnich & McKee

[57] ABSTRACT

A first mother board among a plurality of mother boards is mounted adjacent to a reference mother board and a second mother board among said plurality of mother boards is mounted in a position rotated 180° about the horizontal centerline of the second mother board and mounted back to back to the first mother board, whereby the reference mother board and the first and second mother boards can be interconnected at a minimal distance.

7 Claims, 2 Drawing Sheets

MOUNTING STRUCTURE FOR ELECTRONIC DEVICE

BACKGROUND OF THE INVENTION

This invention relates to an arrangement for mounting mother boards in an electronic device such as a computer which requires high speed operation and high density mounting. More particularly, it is directed to a mounting structure for an electronic device where a plurality of identical mother boards are mounted and arranged in such a manner that they can be interconnected to a reference mother board with minimal cable length.

An example of a conventional mounting technology for electronic devices allowing their boards to be interconnected at a minimal distance is disclosed in Japanese Patent Laid-Open No. 60-98698. In this conventional technology the cases, each of which accommodates a mother board, i.e., a unit, are staggered in order to minimize the length of the cables interconnecting the mother boards.

SUMMARY OF THE INVENTION

The above-mentioned conventional technology is applicable only to a one-case to one-mother board, i.e., one-unit, configuration, and therefore does not address the attempt of minimizing the length of the cables interconnecting one reference mother board with a plurality of other mother boards. Therefore, there will be no advantage of reduced cable length but will be a disadvantage of increased number of cases, whereby it is not suitable for computers and other electronic devices which require high speed operation and high density mounting.

An object of this invention is to overcome the above problems and to thereby provide a mounting structure for electronic devices which is capable of minimizing not only the length of the cables interconnecting a reference mother board with a plurality of other mother boards but also both the surface area for mounting a case and the maintenance area.

According to this invention, the above object can be achieved by mounting a cable connector on a reference mother board adjacent to a plurality of other mother boards and the cable connectors on the plurality of other mother boards adjacent to the reference mother board. More specifically, in the case where the plurality of other mother boards, e.g., two mother boards, are to be mounted at a position nearest possible to the reference mother board, a plurality of other mother boards which are identical must be used to reduce the number of board types, and one of the other mother boards (first mother board) is mounted side by side with the reference mother board, while the other mother board (second mother board) is rotated 180° with the cable connector of the reference mother board as the center of rotation so that the second mother board is mounted on the back of the first mother board with its top and bottom inverted with respect to those of the first mother board.

To further reduce the cable length, the reference mother board may be mounted in a position so that its cable lengths to each of the other two mother boards are equal.

The high speed operation of the electronic device with minimized delay in signal transmission can be achieved by minimizing the cable lengths between the mother boards in the following manner. The cable connector for input/output (I/O) signals of the reference mother board is mounted in a position nearest possible to the other mother boards, while the cable connectors for I/O signals of the other mother boards are also mounted in positions nearest possible to the reference mother board. To mount the first mother board to the reference mother board, the first mother board is simply arranged side by side with the reference mother board; while to mount the second mother board near the reference mother board, the second mother board is rotated so that it is mounted on the back of the first mother board with its top and bottom being inverted with respect to those of the first mother board.

DESCRIPTION OF THE PREFERRED EMBODIMENTS

An embodiment of the mounting structure for an electronic device according this invention will hereunder be described in detail with reference to the drawings.

Figure 1:
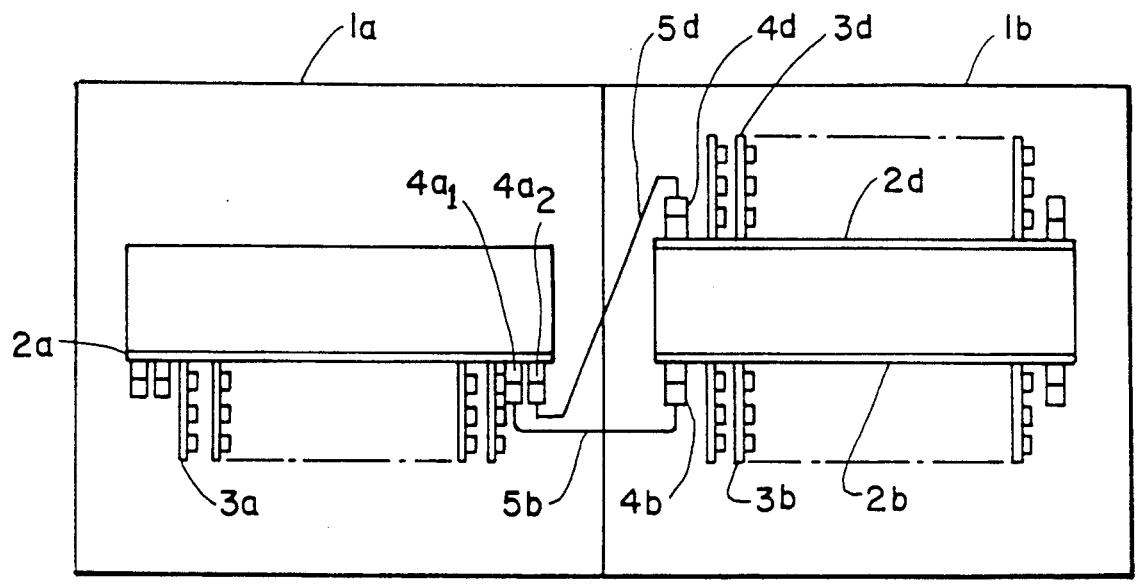
FIG. 1 is a plan view of an embodiment of this invention.
Figure 2:
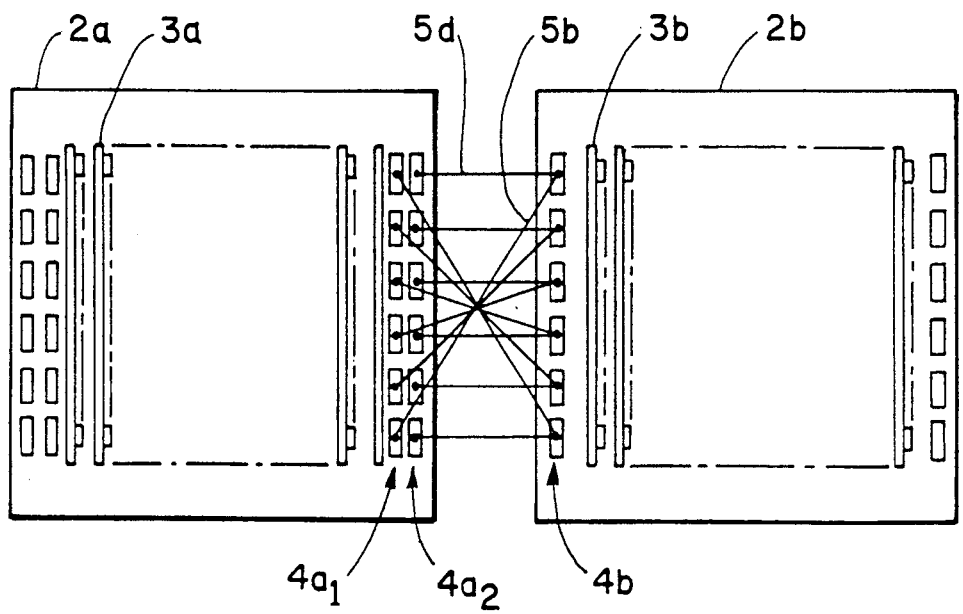
FIG. 2 is a front elevational view of the embodiment shown in FIG. 1.

FIG. 1 is a plan view of the embodiment of this invention; and FIG. 2 is a front elevational view of the embodiment shown in FIG. 1. With reference to FIGS. 1 and 2, a case 1a supports a reference mother board 2a. Similarly, a case 1b supports a first other mother board 2b and a second other mother board 2d. Mounted on the reference mother board 2a are a plurality of daughter boards 3a. Similarly, mounted on first and second other mother boards 2b, 2d are a plurality of daughter boards 3b, 3d. At each end of the reference mother board 2a are a plurality of cable connectors 4a. Similarly at each end of the first and second other mother boards 2b, 2d are a plurality of cable connectors 4b, 4d. In FIGS. 1 and 2, reference numeral 1a designates a case A; 1b, a case B; 2a, a reference mother board A; 2b, a mother board B; 3a, a daughter board A; 3b, a daughter board B; 4a1, 4a2, a connector; 5d, a cable D and 5b a cable B.

In the embodiment shown in FIGS. 1 and 2 the reference mother board 2a and the first other mother board 2b are provided with not only the daughter boards 3a, 3b but also the connectors 4a1, 4a2 for I/O signals. The reference mother board 2a is mounted on the case 1a and the connector al for I/O signals of the reference mother board 2a is mounted adjacent to the first other mother board 2b. Similarly, the first other mother board 2b is mounted adjacent to the reference mother board 2a on the case 1b so that the distance between the connectors 4a1, 4a2 for I/O signals of both the reference mother board and the first other mother board is as short as possible to thereby minimize the length of the cable 5b. Further, a second other mother board 2b which is identical with the first other mother board 2b is mounted on the back of the first other mother board 2b by being rotated; i.e., its top and bottom being inverted with respect to those of the first other mother board 2b, thereby successfully minimizing the distance between the connector 4d for I/O signals of the second other mother board 2d and the connector 4a2 for I/O signals of the reference mother board 2a, which results in minimizing the length of the cable 5d.

In this case, as shown in FIG. 2, the cables 5b between the cable connectors 4a1 of the reference mother board 2a and the cable connectors 4b of the first other mother board 2b are connected so as to intersect, while the cables 5d between the cable connectors 4a2 of the reference mother board 2a and the cable connectors 4d of the second other mother board 2d are connected straight. Accordingly, it is possible to make the sums of the lengths of the cables 5a and 5b equal. In order to further shorten the lengths of the cables, 5d and 5b the reference mother board 5a in FIG. 1 may be shifted backward to such a position on the case 1a calculated as to minimize the cable lengths under discussion.

Figure 3:
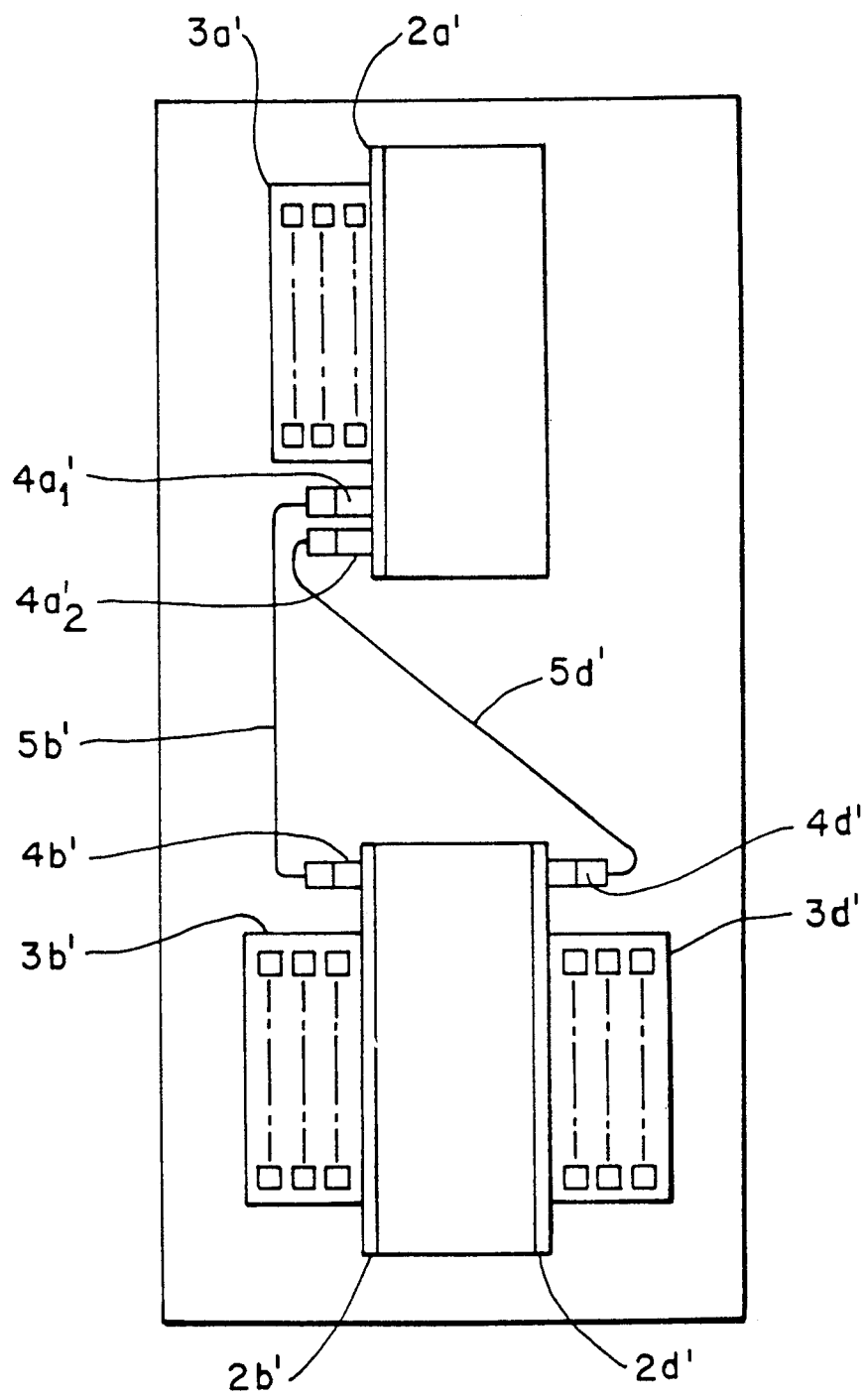
FIG. 3 is a plan view of another embodiment of this invention.

FIG. 3. is a plan view of another embodiment of this invention. In FIG. 3, reference numeral 2a' designates a reference mother board; 3a' a daughter board; 3b', 3d' a daughter board; 5b' a cable; and 5b' a cable.

In this other embodiment of the invention shown in FIG. 3 both the reference mother board and the mother boards are mounted on one case. The two mother boards 2b', 2d' are mounted below the reference mother board 2a'. Also in this configuration, the daughter board 3a' is mounted to the reference mother board 2a' and the daughter boards 3b', 3d' to the other mother boards 2b', 2d', both other mother boards 2b', 2d' being mounted with the top and bottom of the one board inverted with respect to those of the other.

Thus, also in this latter embodiment of the invention it is possible to minimize the lengths of the cables 5b' and 5d' interconnecting between the connectors 4a1', 4a2', 4b', 4d' for I/O signals of both the reference mother board 2a' and the two mother boards 2b', 2d'.

As described above, according to this invention, it is possible to shorten the length of the cable between a reference mother board and a plurality of other mother boards, thereby improving the signal processing speed of an electronic device. According to this invention, it is also possible to mount the mother boards in parallel, thereby not only reducing the mounting space on the case substantially to a half that in the conventional art but reducing the maintenance space as well.

What is claimed is:

1. A mounting structure for an electronic device with a reference mother board having a plurality of daughter boards and cable connectors mounted on a case, comprising:

a plurality of other mother boards having a plurality of daughter boards mounted thereto and an array of cable connectors arranged on one side thereof, similarly to said reference mother board;

said reference mother board being provided with as many arrays of cable connectors as the number of said other mother boards on one side thereof, each of said reference mother board and other mother boards having a front side on which said cable connectors are mounted;

a cable for interconnecting each array of cable connectors of said other mother boards to the corresponding array of cable connectors of said reference mother board; wherein said other mother boards are mounted on said case;

said reference mother board and said other mother boards are mounted so that their corresponding cable connectors can face each other;

a first mother board among said plurality of other mother boards is mounted adjacent to said reference mother board, both boards facing forwardly; and a second mother board which is other than said first mother board among said plurality of other mother boards is mounted facing away from the back of said first mother board adjacent to said reference mother board, the cable connectors of said second mother board facing the corresponding cable connectors of said reference mother board, said second mother board being inverted with respect to said first mother board.

2. A mounting configuration for a electronic device, comprising:

a reference mother board having a plurality of cable connectors near a first end thereof;

a first other mother board, disposed in the plane of the reference mother board, having an array of cable connectors near a first end thereof;

a second other mother board, substantially similar to the reference and first other mother board, having an array of cable connectors near a first end thereof, each of said reference mother board and other mother boards having a front side on which said cable connectors are mounted, the second other mother board being inverted from top of bottom relative to the orientation of the first other mother board;

a plurality of cables extending from the cable connectors of the reference mother board to the corresponding cable connectors of the first and second other mother boards wherein the sum of the lengths of the cables between the cable connectors of the reference mother board and the first mother board is substantially equal to the sum of the lengths of the cables between the cable connectors of the reference mother board and the second other mother board whereby the arrays of cable connectors on the first and second other mother boards are mounted back-to-back and the distance between the cable connectors of the first and second other mother boards is minimized.

3. A mounting arrangement for interconnected mother boards, said configuration comprising:

a reference mother board having a front and a back;

a first other mother board having a front and back and being of an asymmetric configuration;

a second other mother board having a front and back and having a substantially identical configuration to said first other mother board;

connectors mounted on the backs of said reference mother board and said first and second other mother boards, said connectors on the back of said first and second other mother boards being asymmetrically positioned relative to a vertical centerline of said backs of said first and second other mother boards; and, cables extending from said connectors on said back of said reference mother board to said connectors mounted on said backs of said first and second other mother board;

said second other mother board being inverted with respect to said first other mother board, and being mounted back-to-back to said first other mother board, so that said connectors on said back of said second other mother board are approximately the same distance from said connectors on said back of said reference mother board as are said connectors on said back of said first other mother board.

4. The mounting arrangement for interconnected mother boards as in claim 3 wherein said connectors on said back of said reference mother board and on said backs of said first and second other mother boards are configured in a straight, vertical row with one connector being vertically disposed above another, a topmost connector on said reference mother board connected to a lowest connector on said first other mother board, a lowest connector on said reference mother board connected to a topmost connector on said first other mother board.

5. The mounting arrangement of claim 4 wherein said connectors on said back of said reference mother board are configured in a plurality of straight vertical rows with one connector being vertically disposed above another, said cables extending from each of said other mother boards to one of said plurality of straight vertical rows.

6. The mounting arrangement of claim 5 wherein said back of said reference mother board is in the same plane as said back of said first other mother board.

7. The mounting arrangement of claim 6 wherein a topmost connector on said second other mother board is connected via said cable to said topmost connector on said reference mother board, and said lowest connector on said second other mother board is connected via said cable to said lowest connector on said reference mother board, said arrangement effective to allow cables of substantially the same length to connect said reference mother board to either said first or second other mother board.

* * * * *

UNITED STATES PATENT AND TRADEMARK OFFICE
CERTIFICATE OF CORRECTION

PATENT NO. : 5,040,992

DATED : August 20, 1991

INVENTOR(S) : Mitsuo Miyamoto, et al.

It is certified that error appears in the above-identified patent and that said Letters Patent is hereby corrected as shown below:

Claim 2, column 4, line 25, delete "of" and insert therefor --to--.

Signed and Sealed this

Third Day of November, 1992

*Attest:*

DOUGLAS B. COMER

*Attesting Officer*     *Acting Commissioner of Patents and Trademarks*